US00RE49216E

(19) United States
(12) Reissued Patent
Lin

(10) Patent Number: US RE49,216 E
(45) Date of Reissued Patent: Sep. 20, 2022

(54) HEAT SINK SYSTEM HAVING THERMALLY CONDUCTIVE RODS

(71) Applicant: CommScope Technologies LLC, Hickory, NC (US)

(72) Inventor: Philip Lin, Saratoga, CA (US)

(73) Assignee: CommScope Technologies LLC, Hickory, NC (US)

(21) Appl. No.: 15/260,304

(22) Filed: Sep. 8, 2016

Related U.S. Patent Documents

Reissue of:
(64) Patent No.: 8,830,678
Issued: Sep. 9, 2014
Appl. No.: 12/144,734
Filed: Jun. 24, 2008

(51) Int. Cl.
*H01L 23/427* (2006.01)
*F28F 13/00* (2006.01)
*F28F 3/02* (2006.01)

(52) U.S. Cl.
CPC ..... *H01L 23/427* (2013.01); *F28F 13/00* (2013.01); *F28F 3/022* (2013.01); *F28F 2013/005* (2013.01); *H01L 2924/0002* (2013.01)

(58) Field of Classification Search
CPC ..... H01L 24/85; H01L 24/48; H01L 24/06; H01L 2924/1305; H01L 2924/01019; H01L 2924/00014; H01L 2924/13055; H01L 2924/01039; H01L 2924/01013; H01L 2924/01006; H01L 2924/01005; H01L 2224/85206; H01L 2224/85205; H01L 2224/4847; H01L 2224/05624; H01L 2224/05553; H01L 2224/04042
(Continued)

(56) References Cited

U.S. PATENT DOCUMENTS 5,095,404 A * 3/1992 Chao ..... H01L 23/4006 165/104.33
5,359,493 A 10/1994 Chiu
(Continued)

FOREIGN PATENT DOCUMENTS

JP 08186388 * 7/1996 ..... H05K 7/20

OTHER PUBLICATIONS

JP 08186388A (Official translation).*
(Continued)

*Primary Examiner* — Leonardo Andujar
(74) *Attorney, Agent, or Firm* — Fogg & Powers LLC

(57) ABSTRACT

A heat sink system to conduct heat away from a printed circuit board assembly is provided. The heat sink system includes a chassis, a chassis cover, at least one thermally conductive block underlaying a high-heat section of the printed circuit board assembly, a plurality of thermally conductive through-rods, and at least one thermally conductive notch-rod associated with a respective thermally conductive block. The at least one thermally conductive block is in thermal contact with a portion of the chassis. The plurality of thermally conductive through-rods and at least one thermally conductive notch-rod each have a first end and a second end. The through-rods are positioned in holes formed in the printed circuit board. The notch-rods are positioned in a notch formed in the printed circuit board assembly. The first ends thermally contact the thermally conductive block and the second ends thermally contact the chassis cover.

11 Claims, 9 Drawing Sheets

(58) Field of Classification Search
USPC ..... 361/707, 719, 752; 174/547
See application file for complete search history.

(56) References Cited

U.S. PATENT DOCUMENTS

| | | | | |
|---|---|---|---|---|
| 5,375,039 | A * | 12/1994 | Wiesa | H05K 1/0206 174/252 |
| 5,757,621 | A | 5/1998 | Patel | |
| 5,850,333 | A * | 12/1998 | Owanesian et al. | 361/704 |
| 6,185,101 | B1 * | 2/2001 | Itabashi et al. | 361/704 |
| 6,201,701 | B1 * | 3/2001 | Linden | H05K 1/0206 174/252 |
| 6,335,862 | B1 | 1/2002 | Koya | |
| 6,399,209 | B1 * | 6/2002 | Misra | B32B 7/02 257/E23.089 |
| 6,671,177 | B1 * | 12/2003 | Han | 361/719 |
| 7,038,914 | B2 | 5/2006 | Heirich et al. | |
| 7,164,586 | B2 * | 1/2007 | Lin | 361/714 |
| 7,164,587 | B1 * | 1/2007 | Garnett et al. | 361/799 |
| 7,330,355 | B2 * | 2/2008 | Kuo et al. | 361/707 |
| 7,379,302 | B2 * | 5/2008 | Cai et al. | 361/710 |
| 7,505,274 | B2 * | 3/2009 | Yu | 361/710 |
| 2002/0185726 | A1 * | 12/2002 | North | H01L 23/3735 257/707 |
| 2006/0012959 | A1 * | 1/2006 | Lee | G06F 1/20 361/700 |

OTHER PUBLICATIONS

U.S. Patent Office, "Examiner's Answer", "from U.S. Appl. No. 12/144,734", dated Jun. 6, 2011, pp. 1-15, Published in: US.

U.S. Patent Office, "Decision on Appeal", "from U.S. Appl. No. 12/144,734", Feb. 27, 2014, pp. 1-7, Published in: US.

U.S. Patent Office, "Final Office Action", "from U.S. Appl. No. 12/144,734", dated May 28, 2010, pp. 1-13, Published in: US.

U.S. Patent Office, "Notice of Allowance", "from U.S. Appl. No. 12/144,734", dated May 20, 2014, pp. 1-7, Published in: US.

U.S. Patent Office, "Office Action", "from U.S. Appl. No. 12/144,734", dated Jan. 20, 2010, pp. 1-12, Published in: US.

U.S. Patent Office, "Office Action", "from U.S. Appl. No. 12/144,734", dated Nov. 22, 2010, pp. 1-13, Published in: US.

* cited by examiner

HEAT SINK SYSTEM HAVING THERMALLY CONDUCTIVE RODS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATIONS*

*This application is a reissue of application Ser. No. 12/144,735, filed Jun. 24, 2008 which issued as U.S. Pat. No. 8,830,678.*

BACKGROUND

The generation of heat from components on a printed circuit board assembly can adversely impact the operation of components on the printed circuit board assembly. When a printed circuit board assembly carrying a high-heat generating component is housed in a chassis, excessive heat can build up in the chassis to the detriment of the components in the chassis. Thus, it is important to remove the excessive heat from regions of the printed circuit board assembly on which the high-heat generating components are positioned. For example, the components may malfunction when exposed to excessive heat. In some applications, the problem becomes severe when components generate power at more than 0.5 Watts per square inch of surface area.

SUMMARY

In one embodiment, a heat sink system includes a chassis, and a chassis cover to overlay a portion of the chassis so the printed circuit board assembly is enclosed in the chassis. The heat sink system also includes at least one thermally conductive block underlaying a high-heat section of the printed circuit board assembly. The at least one thermally conductive block is in thermal contact with a respective at least one portion of the chassis. The heat sink system also includes a plurality of thermally conductive through-rods that each has a first end and a second end. The first ends thermally contact one of the at least one thermally conductive block and the second ends thermally contact the chassis cover. The through-rods are positioned in a respective plurality of holes formed in the printed circuit board. The heat sink system includes at least one thermally conductive notch-rod associated with a respective thermally conductive block. The at least one thermally conductive notch-rod has a first end and a second end. The first end of the at least one thermally conductive notch-rod thermally contacts the associated thermally conductive block and the at least one second end thermally contacts the chassis cover. The notch-rods are positioned in a notch formed in the printed circuit board assembly.

A second aspect of the present application relates to a method to conduct heat away from a printed circuit board assembly. The method comprises attaching a plurality of thermally conductive through-rods to a thermally conductive block and attaching at least one thermally conductive notch-rod to the thermally conductive block at a thermally conductive interface. Each of the plurality of thermally conductive through-rods is configured to extend through a respective plurality of holes formed in the printed circuit board assembly. The at least one thermally conductive notch-rod is configured to extend into a notch formed in the printed circuit board assembly.

A third aspect of the present application relates to a heat sink to conduct heat away from a printed circuit board assembly. The heat sink comprises a thermally conductive block in which threaded holes are formed, at least one thermally conductive through-rod having a threaded first end, and at least one thermally conductive notch-rod having a threaded first end. The threaded first ends are mated with respective threaded holes. The threaded first end of the at least one thermally conductive through-rod fits through a respective hole formed in the printed circuit board assembly. The threaded first end of the at least one thermally conductive notch-rod extends into a notch formed in the printed circuit board assembly. Heat is conducted away from the high-heat section on the printed circuit board assembly via at least three heat transfer paths.

DRAWINGS

In accordance with common practice, the various described features are not drawn to scale but are drawn to emphasize features relevant to the present invention. Like reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Figure 1:
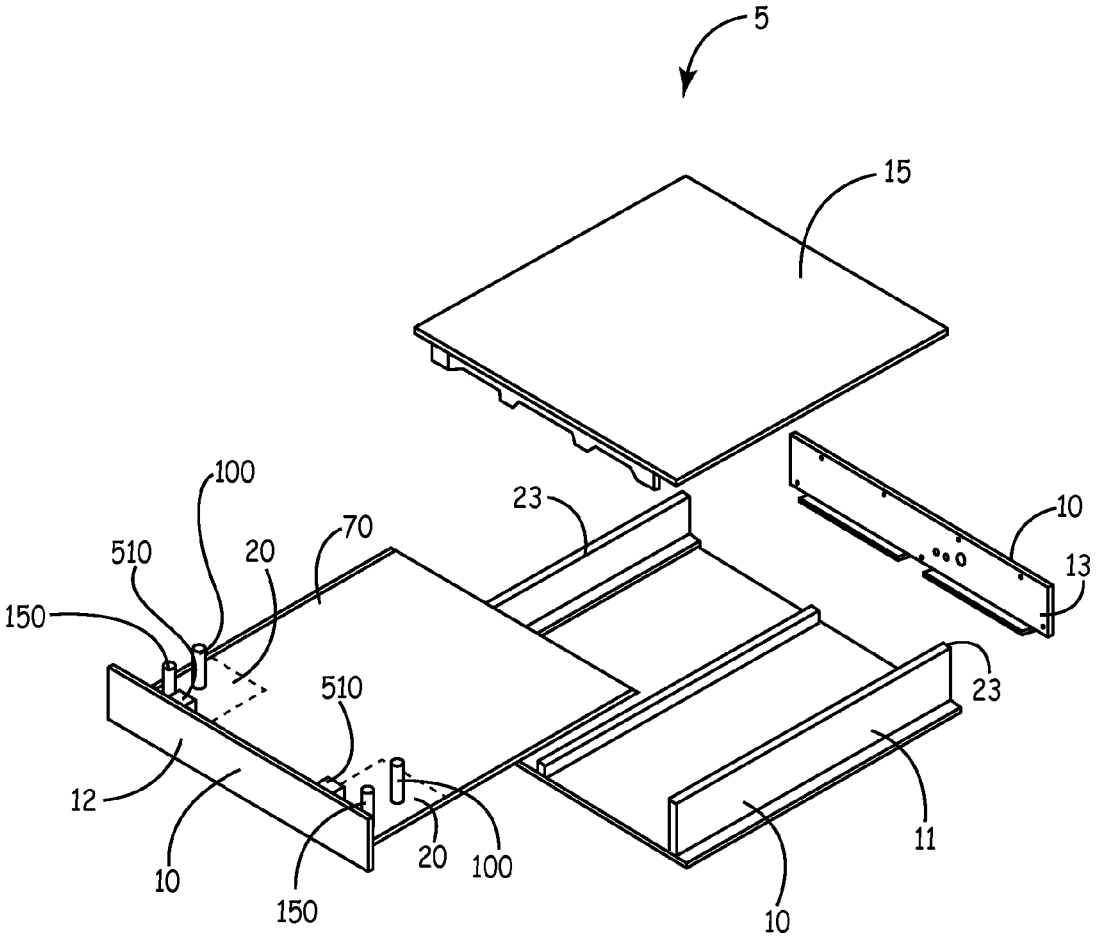
FIG. 1 is an exploded view of one embodiment of a heat sink system to conduct heat away from a printed circuit board assembly.

FIG. 1 is an exploded view of one embodiment of a heat sink system 5 to conduct heat away from a printed circuit board assembly 70. The heat sink system 5 includes a chassis 10, a chassis cover 15 to overlay a portion 23 of the chassis 10, at least one thermally conductive block 20, at least one thermally conductive through-rod 100, and at least one thermally conductive notch-rod 150. The at least one thermally conductive block 20, shown by dashed lines, is obscured by the printed circuit board assembly 70 in this view. High-heat components 510 are shown overlaying the printed circuit board assembly 70 near the thermally conductive through-rod 100, and at least one thermally conductive notch-rod 150. When the cover 15 is attached to the chassis 10, the printed circuit board assembly 70 is enclosed in the chassis 10. The thermally conductive block 20 is in thermal contact with the chassis 10. The chassis 10 includes a chassis frame 11, a front chassis panel 12, and a back chassis panel 13. The thermally conductive through-rods 100 are also referred to herein as "through-rods 100." The thermally conductive notch-rods 150 are also referred to herein as "notch-rods 150." As defined herein, "attached" is "thermally conductively attached." As defined herein, "attaching" is "thermally conductively attaching." As defined herein, "attachment" is "thermal contact."

Figure 2:
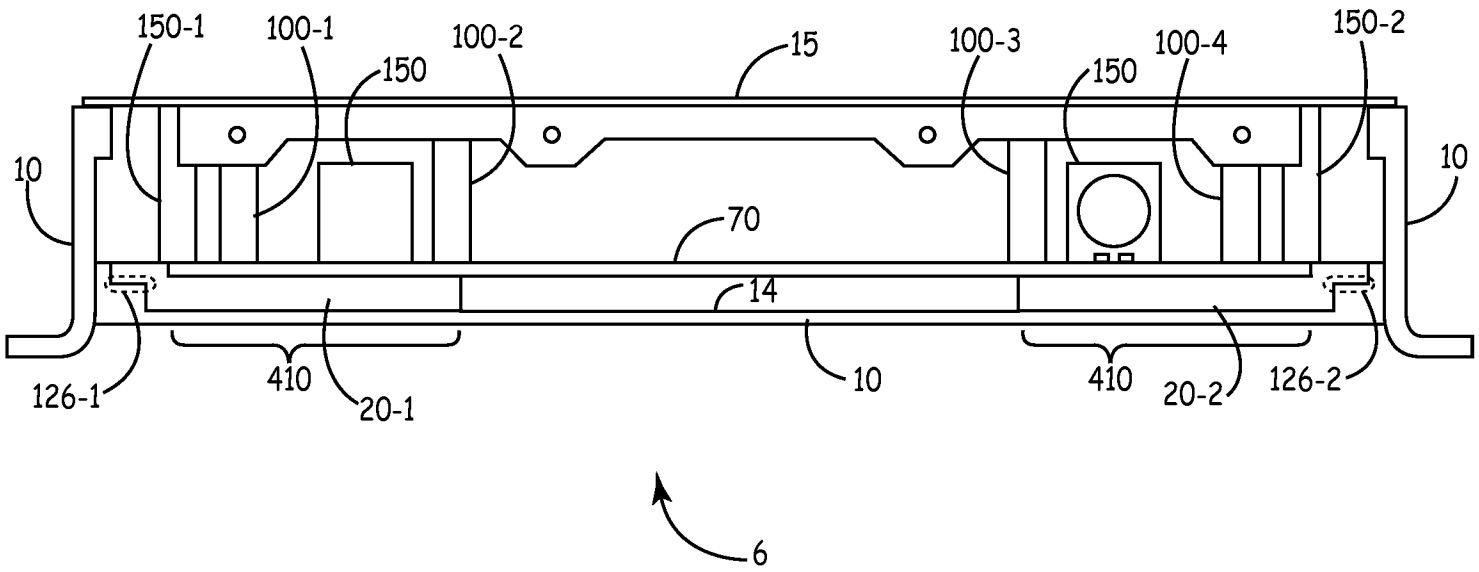
FIG. 2 is a view of one embodiment of a heat sink system to conduct heat away from a printed circuit board assembly.

FIG. 2 is a view of one embodiment of a heat sink system 6 to conduct heat away from a printed circuit board assembly 70. The front chassis panel 12 shown in FIG. 1 is removed in FIG. 2 and the chassis cover 15 is attached to the chassis frame 10. As shown in FIG. 2, two thermally conductive blocks 20(1-2) underlay high-heat sections 410 of the printed circuit board assembly 70. The interface region represented generally at 126(1-2) provides a heat transfer path between the thermally conductive blocks 20(1-2) and a respective at least one portion of the chassis 10. Portions of the two thermally conductive blocks 20(1-2) are positioned between the bottom inner surface 14 of the chassis 10 and the printed circuit board assembly 70.

A plurality of thermally conductive through-rods 100(1-4) are positioned in a respective plurality of holes (not visible in FIG. 2) formed in the printed circuit board 70. As shown in FIG. 2, the thermally conductive through-rods 100(1-2) are positioned in holes in the printed circuit board 70 and thermally contacted to the thermally conductive block 20-1. The thermally conductive through-rods 100(3-4) are positioned in holes in the printed circuit board 70 and thermally contacted to the thermally conductive block 20-2.

The thermally conductive notch-rods 150(1-2) thermally contact the associated thermally conductive block 20(1-2), respectively. The notch-rods 150 are positioned in a notch (not visible in FIG. 2) formed in the printed circuit board assembly 70. As defined herein, "a contact" is "a thermally conductive contact." As defined herein, "contacting" is "thermally conductively contacting." In one implementation of this embodiment, the plurality of through-rods 100 and at least one notch-rod 150 are formed from aluminum. In another implementation of this embodiment, the at least one thermally conductive block 20 is formed from aluminum.

Figure 3:
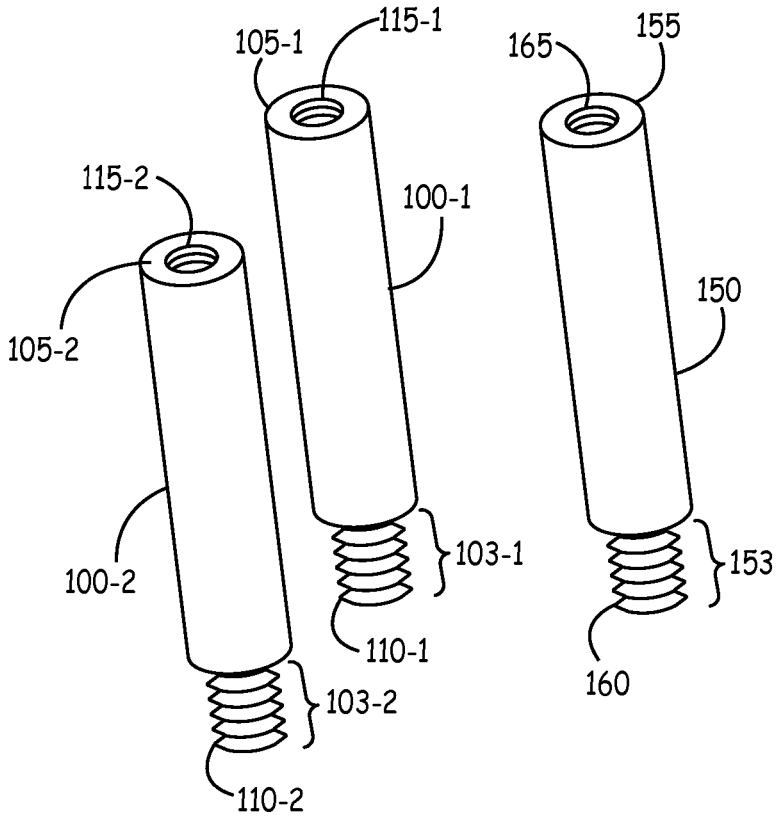
FIG. 3 is an expanded view of one embodiment of thermally conductive through-rods and a thermally conductive notch-rod.

FIG. 3 is an expanded view of one embodiment of thermally conductive through-rods 100(1-2) and a thermally conductive notch-rod 150-1. The thermally conductive through-rods 100(1-2) have a respective first end 103(1-2) and second end 105 (1-2). The first ends 103(1-2) are also referred to herein as "threaded first ends 103(1-2)" since the first ends 103(1-2) have threads 110(1-2), respectively. The thermally conductive notch-rod 150 has a first end 153 and a second end 155. The first end 153 is also referred to herein as a "threaded first end 153" since the first end 153 has threads 160. The second ends 105(1-2) of the thermally conductive through-rods 100(1-2) have respective threaded holes 115(1-2) formed therein to accept screws. The second end 155 of the thermally conductive notch-rod 150 has a threaded hole 165 formed therein to accept a screw.

As shown in FIG. 3, the through-rods 100(1-2) and the notch-rod 150 have a circular cross-section (taken through the length of the through-rods 100(1-2) and the notch-rod 15). In one implementation of this embodiment, the through-rods and the notch-rod have a hexagonal cross-section. In another implementation of this embodiment, the through-rods and the notch-rod have a rectangular cross section. Other cross-sectional shapes are possible.

In yet another implementation of this embodiment, there are no threads on the first ends 103(1-2) and 153. In one embodiment of this case, the thermally conductive through-rods 100(1-2) and the thermally conductive notch-rod 150 are press fit into the thermally conductive block 20 (FIGS. 1 and 2). In another embodiment of this case, the thermally conductive through-rods 100(1-2) and the thermally conductive notch-rod 150 are welded to the thermally conductive block 20 (FIGS. 1 and 2).

Figure 4:
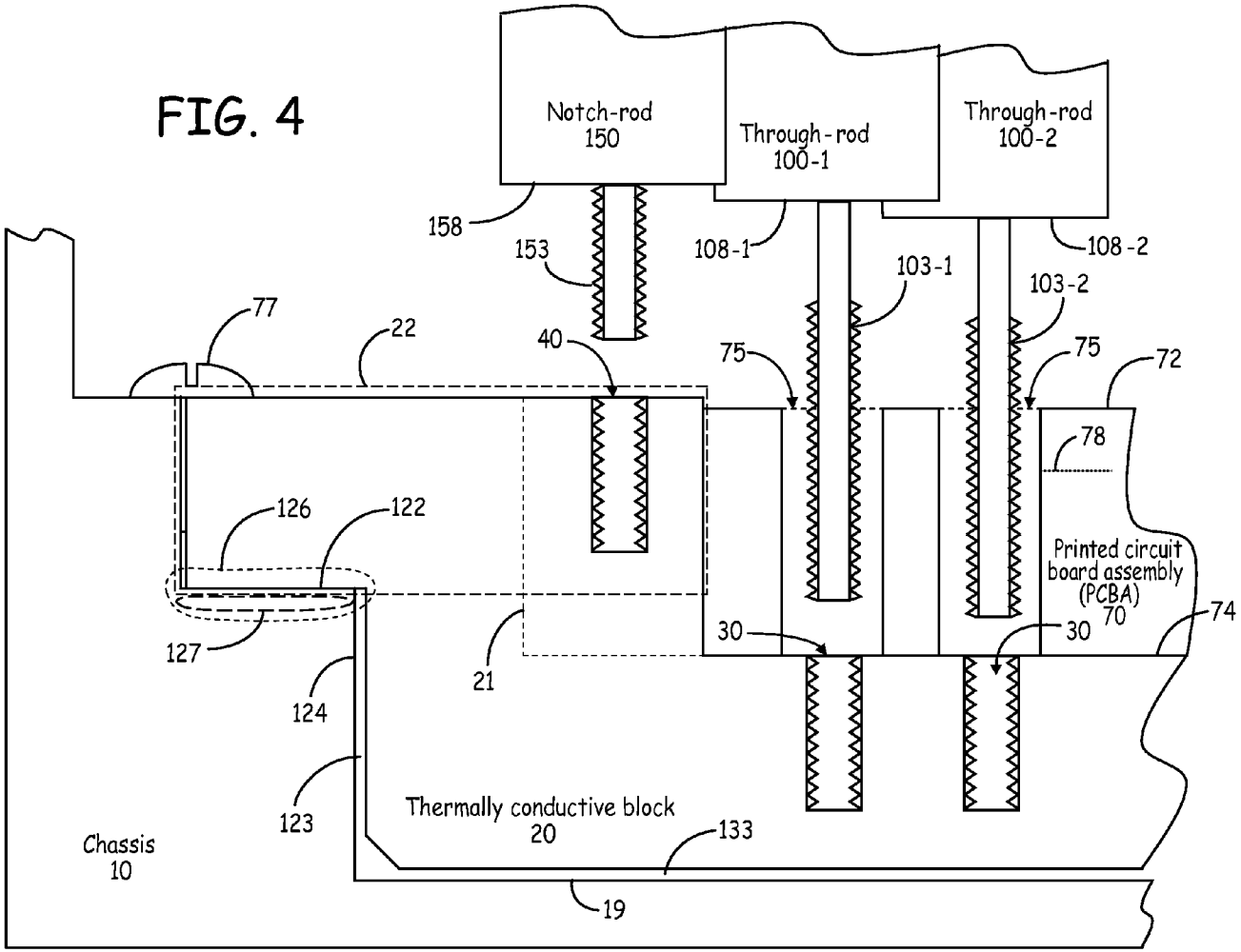
FIG. 4 is a side view of one embodiment of a thermally conductive block in thermal contact with a chassis and a printed circuit board assembly.
Figure 5:
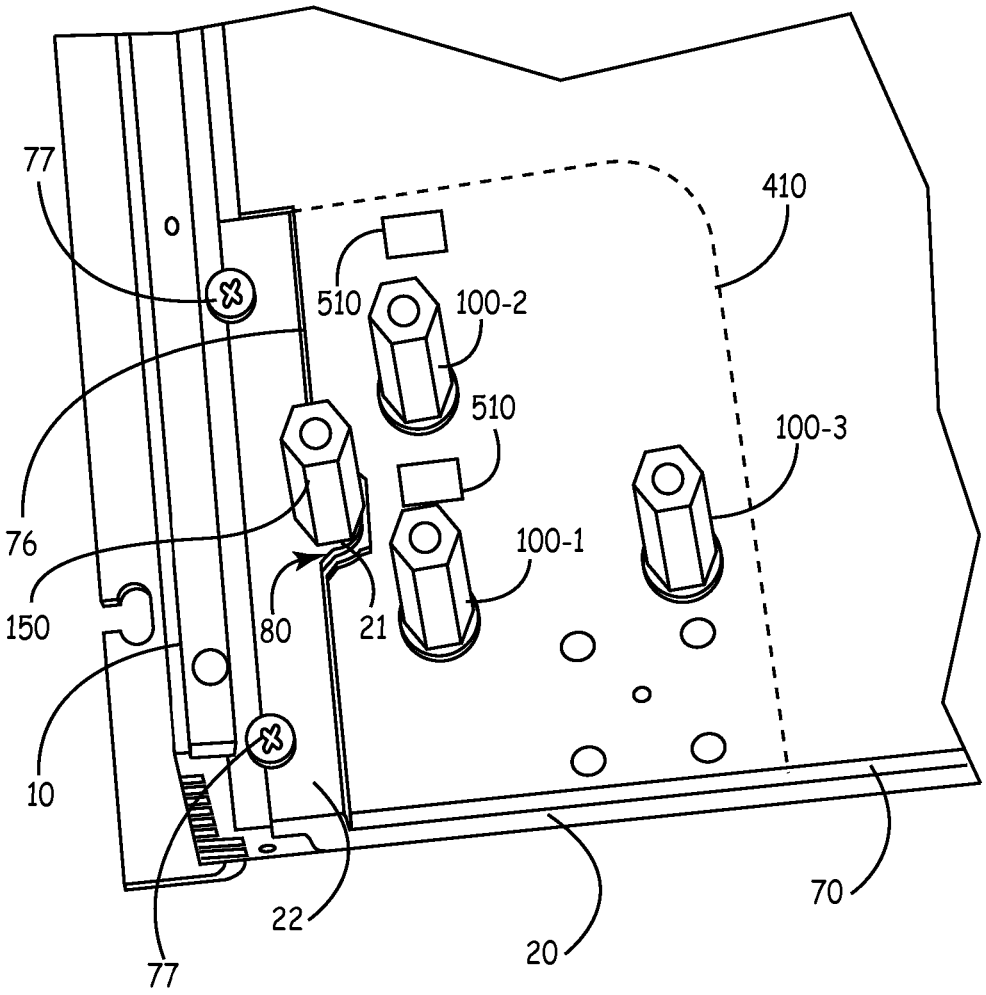
FIG. 5 is an oblique view of one embodiment of a thermally conductive block in thermal contact with a chassis and a printed circuit board assembly.

FIG. 4 is a side view of one embodiment of a thermally conductive block 20 in thermal contact with a chassis 10 and a printed circuit board assembly 70. FIG. 5 is an oblique view of one embodiment of a thermally conductive block 20 in contact with a chassis 10 and a printed circuit board assembly 70.

Three thermally conductive through-rods 100(1-3) are visible in the view seen in FIG. 5. For clarity of the drawing, only two of the thermally conductive through-rods 100(1-2) are visible in FIG. 4. In FIG. 5, high-heat components 510 are shown overlaying the high-heat section 410 of the printed circuit board assembly 70, which in turn overlays the thermally conductive block 20. The high-heat section 410 of the printed circuit board assembly 70 is that portion of the printed circuit board assembly 70 that holds at least one high-heat component 510. The high-heat component 510 is not shown in FIG. 4 for clarity of the drawing.

As shown in FIG. 4, the printed circuit board assembly 70 includes a top surface 72, a bottom surface 74, and at least one middle plane represented generally at 78 in a central region of the printed circuit board assembly 70. As defined herein, the middle plane 78 of the printed circuit board assembly 70 is any plane positioned between the top surface 72 and the bottom surface 74 of the printed circuit board assembly 70. The through-rods 100(1-2) fit through holes 75 formed in the printed circuit board assembly 70. The threaded first ends 103(1-2) of the respective through-rods 100(1-2) screw into the respective threaded holes 30, which are formed in the thermally conductive block 20. In order to attach the through-rods 100(1-2) to the thermally conductive block 20, the threaded first ends 103(1-2) of through-rods 100(1-2) are positioned in the holes 75 and then screwed into a respective plurality of threaded holes 30 in thermally conductive block 20. The threaded first end 103 of the notch-rod 150 is configured to screw into a threaded hole 40 in the thermally conductive block 20 without passing through a hole in the printed circuit board assembly 70.

At least one surface 122 of the thermally conductive interface 22 of the thermally conductive block 20 is in thermal contact with at least one portion 127 of the chassis 10. In this case, the interface region represented generally at 126 provides a segment of a heat transfer path from the thermally conductive block 20 to the chassis 10. A screw 77 (only the head of the screw 77 is visible) secures the thermally conductive interface 22 of the thermally conductive block 20 to the chassis 10 so that the thermally conductive interface 22 of the thermally conductive block 20 is thermally coupled to the portion 127 the chassis 10.

In one implementation of this embodiment, the gap 123 shown between the thermally conductive block 20 and the vertical chassis surface 124 is filled with a thermally conductive material. In another implementation of this embodiment, the thermally conductive block 20 directly contacts the vertical chassis surface 124 and there is no gap 123 between the thermally conductive block 20 and the vertical chassis surface 124. In these latter cases, the interface region 126 is enlarged to include the vertical chassis surface 124.

In another implementation of this embodiment, the gap 133 shown between the thermally conductive block 20 and the bottom inner surface 14 of the chassis 10 is filled with a thermally conductive material. In yet another implementation of this embodiment, the thermally conductive block 20 directly contacts the bottom inner surface 14 of the chassis 10 and there is no gap 133 between the thermally conductive block 20 and the bottom inner surface 14. In these two latter cases, the interface region 126 is enlarged to include the bottom inner surface 14.

As shown in FIG. 5, the thermally conductive notch-rod 150 is attached to the thermally conductive block 20 at a notch section 21 of the thermally conductive interface 22 of the thermally conductive block 20. The notch section 21 of the thermally conductive interface 22 extends into a notch 80 in the printed circuit board assembly 70. The thermally conductive notch-rod 150 extends into the notch 80 formed in the printed circuit board assembly 70 when the first end 153 of the thermally conductive notch-rod 150 is screwed into the hole 40 (FIG. 4) in the notch section 21. As defined herein, a notch 80 is an angular, U-shaped or V-shaped indentation formed in an edge 76 of the printed circuit board assembly 70.

When the threaded first ends 103(1-2) of the respective through-rods 100(1-2) screw into the respective threaded holes 30 in the thermally conductive block 20, the surfaces 108(1-2) of the respective through-rods 100(1-2) are in thermal contact with the top surface 72 of the printed circuit board assembly 70. Likewise, the first ends 103(1-2) of the respective through-rods 150(1-2) are in thermal contact with the thermally conductive block 20.

When the threaded first end 153 of the notch-rod 150 screws into the threaded hole 40 in the thermally conductive block 20, the threaded first end 153 and the surface 158 of the thermally conductive notch-rod 150 are in thermal contact with the notch section 21 of the thermally conductive block 20.

The high-heat components 510 shown in FIG. 5 are in proximity to the thermally conductive through-rods 150(1-3). In one implementation of this embodiment, the high-heat components 510 are components that generate power at more than 0.5 Watts per square inch of surface area on the printed circuit board assembly 70. In another implementation of this embodiment, high-heat components 510 are components that generate power at more than 2 Watts per square inch of surface area on the printed circuit board assembly 70.

Figure 6:
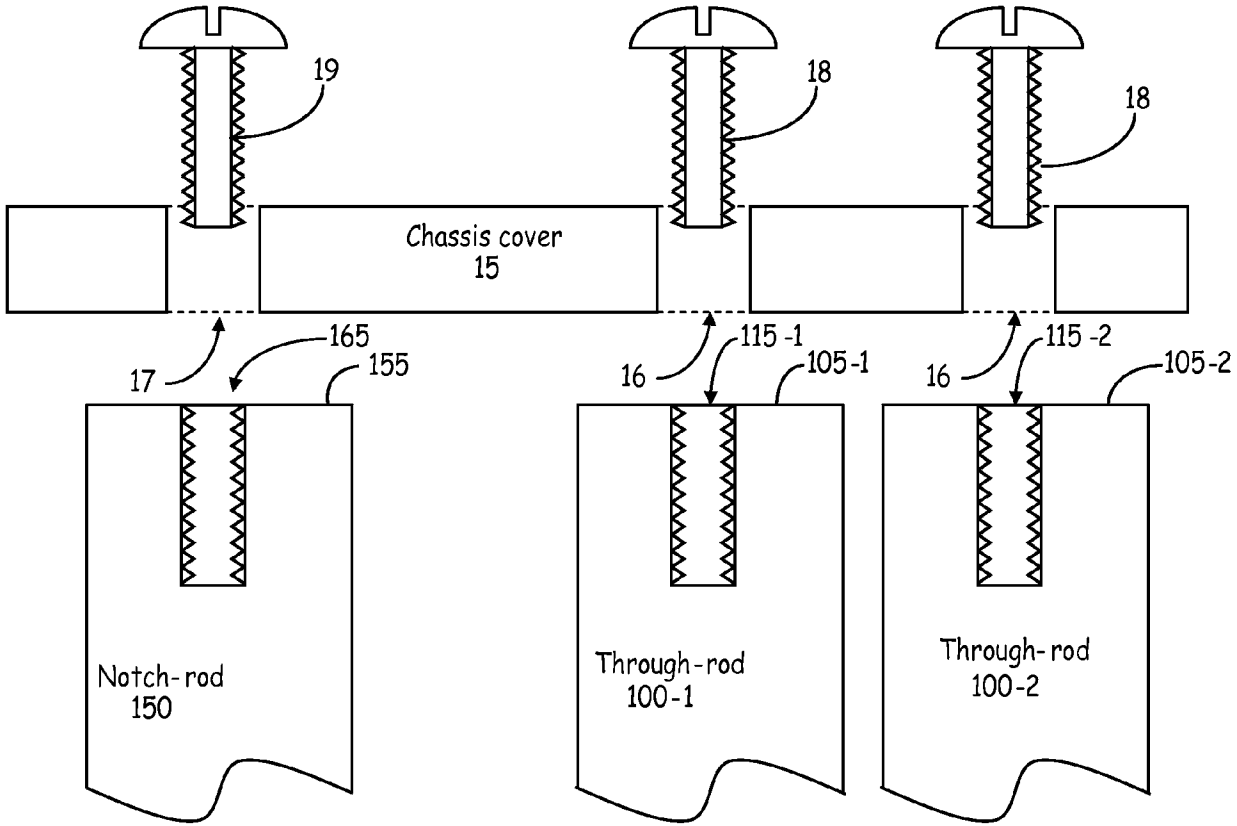
FIG. 6 is a side view of one embodiment of a chassis cover, second ends of the thermally conductive through-rods, and a second end of the thermally conductive notch-rod.

FIG. 6 is a side view of one embodiment of a chassis cover 15, second ends 105(1-2) of the thermally conductive through-rods 100(1-2), and a second end 155 of the thermally conductive notch-rod 150. The second ends 105(1-2) of the through-rods 100(1-2) include threaded holes 115(1-2) to accept screws 18. The chassis cover 15 has through-holes 16 formed therein for screws 18 to pass through. The chassis cover 15 is secured to the through-rods 100(1-2) when screws 18 inserted through the through-holes 16 in the chassis cover 15 are screwed into the threaded holes 115(1-2) in the second ends 105(1-2) of the through-rods 100(1-2). When secured in this manner, the chassis cover 15 is thermally contacted with the thermally conductive through-rods 100(1-2).

The second end 155 of the notch-rod 150 has a threaded hole 165 formed therein to accept a screw 19. The chassis cover 15 is secured to the notch-rod 150 when the screw 19 is inserted through the through-hole 17 in the chassis cover 15 and screwed into the threaded hole 165 in the second end 155 of the notch-rod 150. The second ends 105(1-2) and 155 of the respective thermally conductive through-rods 150(1-2) and the thermally conductive notch-rod 150 are in thermal contact with the chassis cover 15 when the screws 18 and 19 are tightened in respective threaded holes 115(1-2) and threaded hole 165. When secured in this manner, the chassis cover 15 is thermally contacted with the thermally conductive notch-rod 150.

When the at least one thermally conductive block 20 is positioned proximal a respective at least one high-heat section 410 of the printed circuit board assembly 70 and when the thermally conductive through-rods 100(1-2) and the thermally conductive notch-rod 150 are attached to the at least one thermally conductive block 20 and the chassis cover 15, heat is conducted away from the high-heat section 410 (FIG. 2) on the printed circuit board assembly 70 via at least three heat transfer paths.

Figure 7:
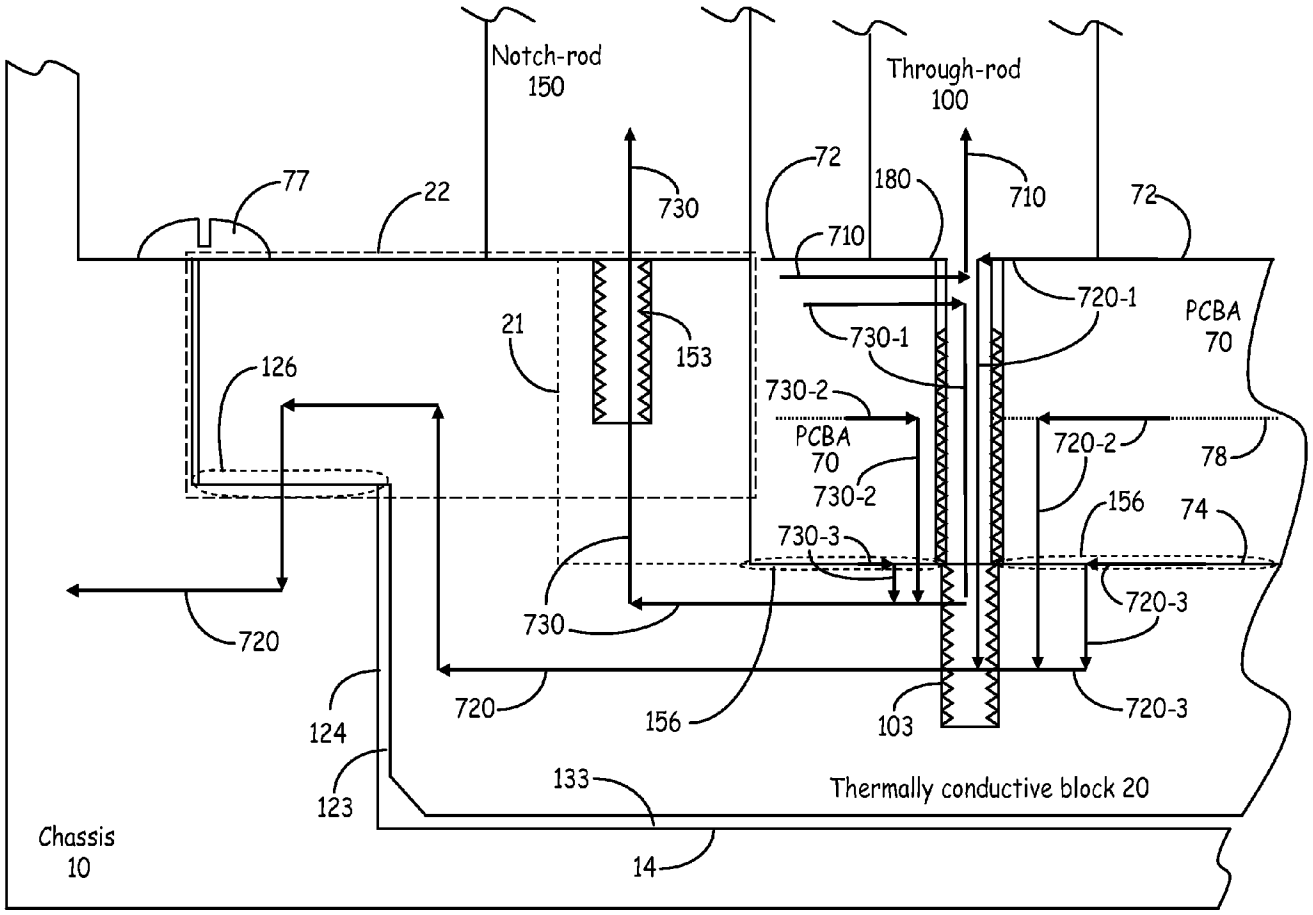
FIG. 7 shows embodiments of three heat transfer paths within the heat sink system.

FIG. 7 shows embodiments of three heat transfer paths within the heat sink system 3. Heat is conducted from a printed circuit board assembly 70 to a through-rod 100 to the chassis cover 15 via a first heat transfer path represented generally at 710. Heat is conducted from the printed circuit board assembly 70 to a through-rod 100 to one of the at least one thermally conductive block 20 to the chassis 10 via the second heat transfer path represented generally at 720. Heat is conducted from the printed circuit board assembly 10 to a through-rod 100 to one of the at least one thermally conductive block 20 to a notch-rod 150 to the chassis cover 15 via the third heat transfer path represented generally at 730. Only one of the plurality of thermally conductive through-rods 100(1-3) (FIG. 5) is shown in FIG. 7 for clarity of the drawing. It is to be understood that the three heat transfer paths 710, 720, and 730 shown in FIG. 7 can be extended to a plurality of heat transfer paths, one for each of the plurality of thermally conductive through-rods in the heat sink system 3.

The first heat transfer path 710 conducts heat from the top surface 72 of the printed circuit board assembly (PCBA) 70 to the through-rod 100 to the chassis cover 15.

The interface region represented generally at 156 provides a heat transfer path between the printed circuit board assembly 70 and at least one portion of the thermally conductive block 20. The second heat transfer path 720 includes the interface region 156 between the bottom surface 74 of the printed circuit board assembly 70 and at least one portion of the thermally conductive block 20.

The second heat transfer path 720 is a branched heat transfer path that includes three branches represented generally at 720(1-3). The first branch 720-1 of second heat transfer path 720 conducts heat from the top surface 72 of the printed circuit board assembly 70 to the through-rod 100 to the thermally conductive block 20 to the chassis 10. The second branch 720-2 of second heat transfer path 720 conducts heat from the middle plane 78 to the thermally conductive block 20, via the interface region 156, to the chassis 10. The third branch 720-3 of second heat transfer path 720 conducts heat from the bottom surface 74 to the thermally conductive block 20, via the interface region 156, to the chassis 10. In one implementation of this embodiment, the second branch 720-2 of second heat transfer path 720 conducts heat from the middle plane 78 to the through-rod 100 to the thermally conductive block 20 to the chassis 10. In another implementation of this embodiment, the third branch 720-3 of second heat transfer path 720 conducts heat from the bottom surface 74 to the through-rod 100 to the thermally conductive block 20 to the chassis 10.

The interface region represented generally at 126(1-2) (FIG. 2) provides a heat transfer path between the thermally conductive blocks 20(1-2) and a respective at least one portion of the chassis 10. The second heat transfer path 720 includes the interface region 126, as shown in FIG. 4, where the thermally conductive interface 22 of the thermally conductive block 20 is thermally coupled to the chassis 10.

The third heat transfer path 730 conducts heat from the printed circuit board assembly surface 72 to the through-rod 100 the thermally conductive block 20 to the notch-rod 150 to the chassis cover 15. The third heat transfer path 730 includes the notch section 21 of the thermally conductive block 20. The notch section 21 is thermally coupled to the first end 153 of the thermally conductive notch-rod 150.

The third heat transfer path 730 includes the interface region 156 between the bottom surface 74 of the printed circuit board assembly 70 and at least one portion of the thermally conductive block 20. The third heat transfer path 730 is a branched heat transfer path that includes three branches represented generally at 730(1-3). The first branch 730-1 of the third heat transfer path 730 conducts heat from top surface 72 of the printed circuit board assembly 70 to the through-rod 100 to the thermally conductive block 20. The second branch 730-2 of the third heat transfer path 730 conducts heat from the middle plane 78 to the thermally conductive block 20 via the interface region 156. The third branch 730-3 of the third heat transfer path 730 conducts heat from the bottom surface 74 of the printed circuit board assembly 70 to the thermally conductive block 20 via the interface region 156. In one implementation of this embodiment, the third branch 730-2 of third heat transfer path 730 conducts heat from the middle plane 78 to the through-rod 100 to the thermally conductive block 20 to the chassis 10. In another implementation of this embodiment, the third branch 730-3 of third heat transfer path 730 conducts heat from the bottom surface 74 to the through-rod 100 to the thermally conductive block 20 to the chassis 10.

Figure 8:
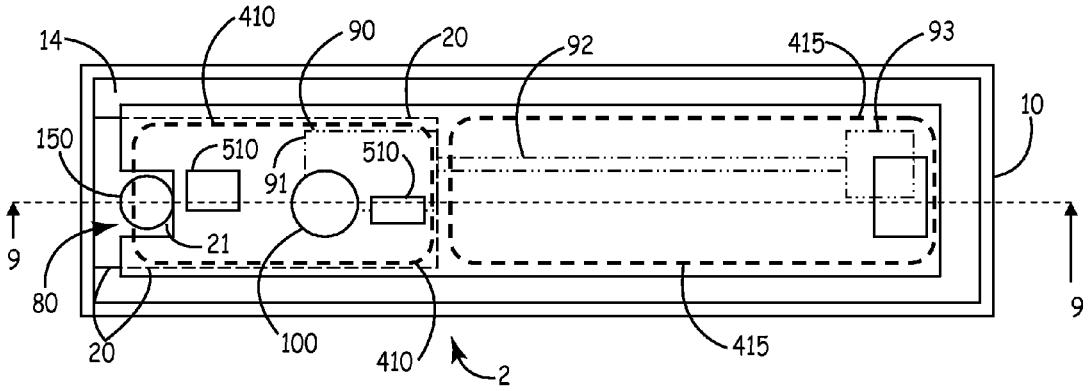
FIG. 8 shows a top view of an embodiment of a heat sink system.
Figure 9:
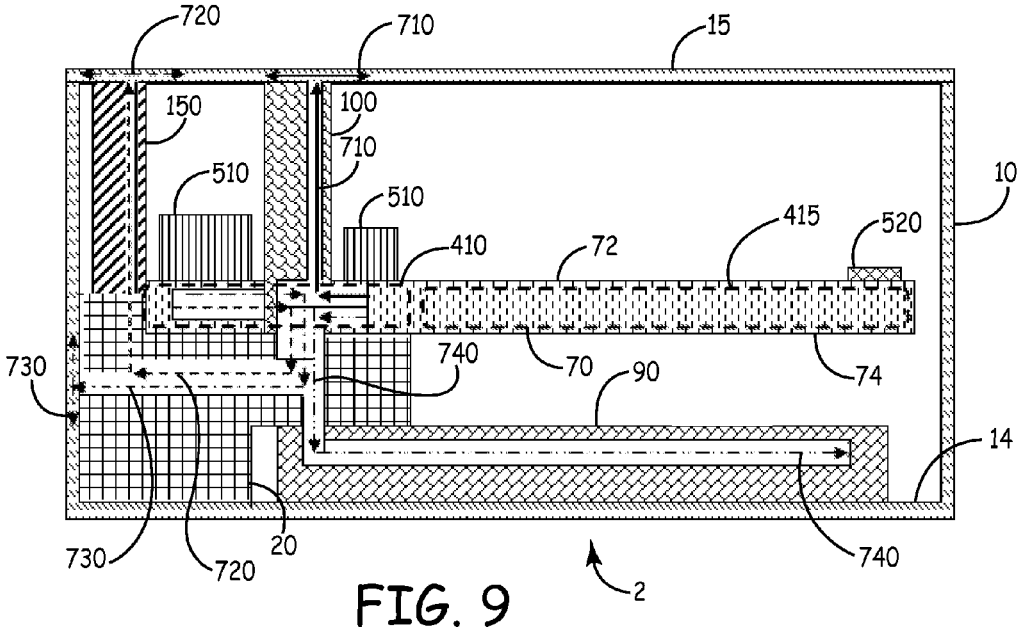
FIG. 9 shows a cross-sectional view of the heat sink system of FIG. 8 in which four heat transfer paths are indicated.

FIG. 8 shows a top view of an embodiment of a heat sink system 2. FIG. 9 shows a cross-sectional view of the heat sink system 2 of FIG. 8 in which four heat transfer paths are indicated. The plane upon which the cross-section view of FIG. 9 is taken is indicated by section line 9-9 in FIG. 8. Only one thermally conductive through-rod 100 is shown in FIGS. 8 and 9 for clarity of the drawings, however, it is to be understood that other embodiments include a plurality of thermally conductive through-rods, such as thermally conductive through-rods 100(1-3) (FIG. 5).

The heat sink system 2 includes the components of the heat sink system 3 (FIG. 7) and a heat pipe 90. The heat pipe 90 includes a high-heat pipe section 91 and a low-heat pipe section 93 that are thermally coupled by a narrow-pipe 92. In the heat sink system 2, there are four heat transfer paths 710, 720, 730, and 740. The heat pipe 90 is operably attached to the thermally conductive block 20 to conduct heat from the printed circuit board assembly 70 to the thermally conductive through-rod 100 to the thermally conductive block 20 to the heat pipe 90, so that heat is directed via the heat pipe 90 to a low-heat section 415 within the chassis 10. As seen in FIGS. 8 and 9, the notch 80 in the printed circuit board assembly 70 is large enough to permit the notch section 21 (see FIG. 5 for oblique view) of the thermally conductive block 20 to extend into the notch 80. The notch section 21 is a base to which the thermally conductive notch-rod 150 is attached. In one implementation of this embodiment, the top surface of the notch section 21 is in a plane with the top surface 72 of the printed circuit board assembly 70.

In the embodiment of the heat sink system 2 shown in FIGS. 8 and 9, there are two high-heat components 510 that create the high-heat section 410 of the printed circuit board assembly 70 and a low-heat component 520 that is in the low-heat section 415 of the printed circuit board assembly 70. The high-heat section 410 overlays the thermally conductive block 20 and is spatially separate from the low-heat section 415. In one implementation of this embodiment, a low-heat component 520 generates power at less than 0.5 Watts per square inch of surface area on the printed circuit board assembly 70. In another implementation of this embodiment, a low-heat component 520 generates power at less than 0.25 Watts per square inch of surface area on the printed circuit board assembly 70.

The heat pipe 90 extends from the high-heat section 410 to a region within the chassis 10 that is proximal to the low-heat section 415. The high-heat pipe section 91 of the heat pipe 90 is thermally coupled at least a portion of the thermally conductive block 20 that is positioned under the high-heat section 410 of the printed circuit board assembly 70. The heat pipe 90 is configured so that the low-heat pipe section 93 is positioned between the low-heat section 415 of the printed circuit board assembly 70 and the bottom inner surface 14 of the chassis 10. As shown in FIG. 9, the heat pipe 90 contacts the bottom inner surface 14 of the chassis 10 to distribute heat to the chassis 10. In another implementation of this embodiment, the heat pipe 90 does not contact the bottom inner surface 14 of the chassis 10 but is suspended between the low-heat section 415 of the printed circuit board assembly 70 and the bottom inner surface 14 of the chassis 10.

The heat pipe 90 is tubular or thin planer sealed pipe or tube made of a material with high thermal conductivity such as copper or aluminium that is used to move heat from a high-heat area, such as high-heat section 410, to a lower heat area, such as low-heat section 415. The heat pipe 90 is filled with a fraction of a percent by volume of fluid chosen to match the operating temperature of the printed circuit board assembly 70. Some example fluids are water, ethanol, acetone, sodium, or mercury.

Figure 10:
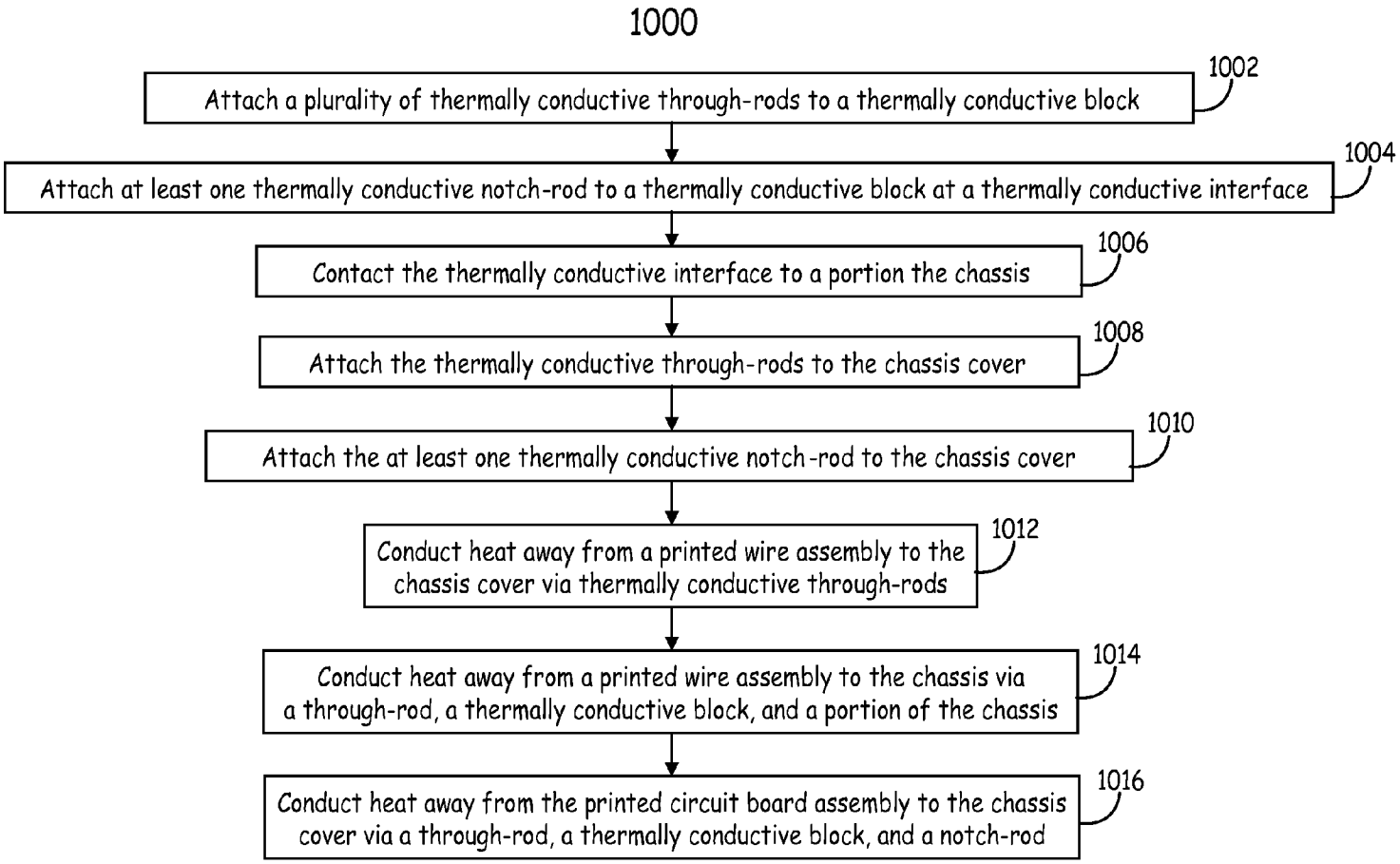
FIG. 10 is a flow diagram of one embodiment of a method to remove heat from a printed circuit board assembly.

FIG. 10 is a flow diagram of one embodiment of a method 1000 to conduct heat away from a printed circuit board assembly. In one implementation of this embodiment, the printed circuit board assembly is housed in a chassis enclosed by a chassis cover. Method 1000 is described herein with reference to the heat sink system 3 of FIG. 7 and with reference to FIGS. 4, 5, and 6. However, it is to be understood that method 1000 is applicable to other embodiments of heat sink systems.

At block 1002, a plurality of thermally conductive through-rods 100 are attached to a thermally conductive block 20. The plurality of thermally conductive through-rods 100(1-2) are configured to extend through a respective plurality of holes 75 (FIG. 4) in the printed circuit board assembly 70. The plurality of holes 75 are in a high-heat section 410 (FIG. 5) of the printed circuit board assembly 70.

At block 1004, at least one thermally conductive notch-rod 150 is attached to a thermally conductive block 20 at the thermally conductive interface 22 (FIG. 4). The at least one thermally conductive notch-rod 150 is configured to extend into the notch 80 (FIG. 5) formed in the printed circuit board assembly 70. The notch 80 is formed at the edge 76 of a high-heat section 410 of the printed circuit board assembly 70.

In one implementation of this embodiment, at least one thermally conductive notch-rod 150 is attached to the thermally conductive block 20 at the thermally conductive interface 22 by screwing a threaded first end 153 of the at least one thermally conductive notch-rod 150 into a respective at least one of a threaded hole 40 (FIG. 4) in the thermally conductive interface 22. In another implementation of this embodiment, the at least one thermally conductive notch-rod 150 is attached to the thermally conductive block 20 at the thermally conductive interface 22 by force fitting the thermally conductive notch-rod 150 into a hole formed in the thermally conductive block 20. In yet another implementation of this embodiment, the at least one thermally conductive notch-rod 150 is formed as part of the thermally conductive block 20.

At block 1006, the thermally conductive interface 22 contacts a portion 127 (FIG. 4) the chassis 10 so the at least one thermally conductive block 20 is thermally coupled to the chassis 10. The extent of the interface region 126 (FIG. 4) between the portion 127 of the chassis 10 and the thermally conductive block 20 is based on the shape of the chassis 10 and the shape of the thermally conductive block 20. In one implementation of this embodiment, at least one screw 77 (FIGS. 4 and 5) is used to attach the thermally conductive block 20 to the chassis 10. In another implementation of this embodiment, a thermally conductive adhesive is used to attach the thermally conductive block 20 to the chassis 10.

At block 1008, the thermally conductive through-rods 100 are attached to the chassis cover 15 (FIG. 6). In one implementation of this embodiment, the thermally conductive through-rods 100 are attached to the chassis cover 15 by inserting a plurality of screws 18 through a respective plurality of holes 16 in the chassis cover 15 and screwing the plurality of screws 18 into respective threaded holes 115 in second ends 105 of the plurality of thermally conductive through-rods 100.

At block 1010, the at least one thermally conductive notch-rod 150 is attached to the chassis cover 15. In one implementation of this embodiment, the at least one thermally conductive notch-rod 150 is attached to the chassis cover 15 by inserting at least one screw 19 through a respective at least one hole 17 in the chassis cover 15 and screwing the at least one screw 19 into a respective threaded hole 165 in a second end 155 of the at least one thermally conductive notch-rod 150.

At block 1012, heat is conducted away from a printed wire assembly 70 to the chassis cover 15 via at least one thermally conductive through-rod 100. For example, heat is conducted away from a printed wire assembly 70 to the chassis cover 15 via the first heat transfer path 710 (FIG. 7). The first heat transfer path 710 is established when the steps at blocks 1002-1010 are implemented.

At block 1014, heat is conducted away from the printed wire assembly surface 72 to the chassis 10 via at least one through-rod 100, one of the at least one thermally conductive blocks 20, and a portion of the chassis 127 (FIG. 4). For example, heat is conducted away from the printed wire assembly surface 72 to the chassis 10 via the branched second heat transfer path 720 (FIG. 7). The second heat transfer path 720 is established when the steps at blocks 1002-1010 are implemented.

At block 1016, heat is conducted away from the printed circuit board assembly 70 to the chassis cover 15 via a through-rod 100, one of the at least one thermally conductive blocks 20, and a notch-rod 150. For example, heat is conducted away from the printed circuit board assembly 70 to the chassis cover 15 via the branched third heat transfer path 730 (FIG. 7). The third heat transfer path 730 is established when the steps at blocks 1002-1010 are implemented.

It is to be understood that when a plurality of thermally conductive through-rods are used in the heat sink system, a respective plurality of first heat transfer paths 710, second heat transfer paths 720, and third heat transfer paths 730 are established. Likewise, when more than one thermally conductive block 20 is used in the heat sink system, a respective more than one first heat transfer path 710, second heat transfer path 720, and third heat transfer path 730 are established in each of the thermally conductive blocks 20. For example, when a heat sink system includes two thermally conductive blocks 20(1-2) that are each in thermal contact with three thermally conductive through-rods 100 (1-3) and one thermally conductive notch-rod 150, then six first heat transfer paths 710, six second heat transfer paths 720, and six third heat transfer paths 730 are established in the heat sink system as is understandable from reading this document.

In one implementation of this embodiment, the chassis 10 and/or chassis cover 15 have heat fins to further facilitate the removal of heat from the high-heat section 410 of the printed circuit board assembly 70.

In another implementation of a method to remove heat from a printed circuit board assembly housed in a chassis enclosed by a chassis cover, a high-heat pipe section 91 of a heat pipe 90 is attached to a portion of the thermally conductive block 20 that underlays the high-heat section 410 of the printed circuit board assembly 70. In such an embodiment, a fourth heat transfer path (such as fourth heat transfer path 740) is established to direct heat away from the high-heat section 410.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof

What is claimed is:

1. A heat sink system to conduct heat away from a printed circuit board assembly, the heat sink system comprising:

a chassis;

a chassis cover to overlay a portion of the chassis, wherein the printed circuit board assembly is enclosed in the chassis;

at least one thermally conductive block underlaying a high-heat section of the printed circuit board assembly, the at least one thermally conductive block in thermal contact with a respective at least one portion of the chassis;

a plurality of thermally conductive through-rods each having a first end and a second end, wherein the plurality of first ends thermally contact one of the at least one thermally conductive block and wherein the plurality of second ends thermally contact the chassis cover, wherein the plurality of through-rods are positioned in a respective plurality of holes formed in the printed circuit board; and at least one thermally conductive notch-rod associated with a respective thermally conductive block, the at least one thermally conductive notch-rod having a first end and a second end, wherein the at least one first end of the at least one thermally conductive notch-rod thermally contacts the associated thermally conductive block and wherein the at least one second end thermally contacts the chassis cover, wherein the at least one notch-rod is positioned in a notch formed in the printed circuit board assembly.

2. The heat sink system of claim 1, wherein:

heat is conducted from the printed circuit board assembly to the plurality of through-rods to the chassis cover;

heat is conducted from the printed circuit board assembly to the plurality of through-rods to one of the at least one thermally conductive block to the chassis; and heat is conducted from the printed circuit board assembly to the plurality of through-rods to one of the at least one thermally conductive block to the at least one notch-rod to the chassis cover.

3. The heat sink system of claim 2, wherein the at least one thermally conductive block is thermally coupled to a heat pipe, wherein heat is conducted from the printed circuit board assembly to the plurality of through-rods to one of the at least one thermally conductive block to the heat pipe, wherein heat is directed to a low-heat section within the chassis.

4. The heat sink system of claim 1, wherein the plurality of first ends of the respective plurality of through-rods and the at least one notch-rod have threads, wherein the plurality of first ends of the respective plurality of through-rods screw into a respective plurality of threaded holes formed in the at least one thermally conductive block, and wherein the at least one first end of the at least one notch-rod screws into at least one respective threaded hole in the at least one thermally conductive block.

5. The heat sink system of claim 1, wherein the plurality of second ends of the plurality of through-rods have threaded holes formed therein to accept screws, wherein the chassis cover has through-holes formed therein for the screws, and wherein the chassis cover is secured to the plurality of through-rods when the screws inserted through the through-holes in the chassis cover are screwed into the threaded holes in the second ends of the plurality of through-rods, and wherein the second end of each of the at least one notch-rod has a threaded hole formed therein to accept the screw, and wherein the chassis cover is secured to the at least one notch-rod when the screw inserted through a through-hole in the chassis cover is screwed into the threaded hole in the second end of the at least one notch-rod.

6. The heat sink system of claim 1, wherein the at least one thermally conductive block includes a thermally conductive interface that thermally contacts the at least one portion of the chassis, wherein the at least one thermally conductive notch-rod thermally contacts the thermally conductive interface of the at least one thermally conductive block.

7. The heat sink system of claim 1, wherein the plurality of through-rods and the at least one notch-rod are formed from aluminum.

8. The heat sink system of claim 1, wherein the at least one thermally conductive block is formed from aluminum.

9. The heat sink system of claim 1, wherein each of the plurality of thermally conductive blocks is thermally contacted by at least one thermally conductive notch-rod.

*10. A heat sink system comprising:*

*a printed circuit board having a first surface and a second surface, the first surface having at least one high-heat component mounted thereon;*

*at least one thermally conductive block interfacing with the second surface and underlaying the high-heat component;*

*a plurality of thermally conductive rods extending out from a surface of the thermally conductive block and each defining a heat transfer path conducting heat away from the high-heat component to at least one heat sinking element, wherein the plurality of thermally conductive rods do not pass through a hole in the printed circuit board.*

*11. The system of claim 10, wherein the at least one heat sinking element comprises fins.*

* * * * *